United States Patent
Lin et al.

(10) Patent No.: US 11,489,539 B1
(45) Date of Patent: Nov. 1, 2022

(54) ANALOG-TO-DIGITAL CONVERTER AND METHOD OF OPERATING SAME

(71) Applicant: Realtek Semiconductor Corp., HsinChu (TW)

(72) Inventors: Kai-Yue Lin, Hsinchu (TW); Wei-Jyun Wang, Hsinchu (TW); Shih-Hsiung Huang, Hsinchu (TW); Kai-Yin Liu, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/474,017

(22) Filed: Sep. 13, 2021

(30) Foreign Application Priority Data

Apr. 8, 2021 (TW) .................................. 110112713

(51) Int. Cl.
*H03M 1/12* (2006.01)
*H03M 1/46* (2006.01)

(52) U.S. Cl.
CPC .......... *H03M 1/1245* (2013.01); *H03M 1/462* (2013.01); *H03M 1/466* (2013.01)

(58) Field of Classification Search
CPC ...... H03M 1/468; H03M 1/462; H03M 1/804; H03M 1/1245; H03M 1/466; H03M 1/0863; H03M 1/14; H03M 1/38; H03M 1/002; H03M 1/0682; H03M 1/1033; H03M 1/68; H03M 1/806; H03M 1/00; H03M 1/001; H03M 1/06; H03M 1/0607; H03M 1/0617; H03M 1/0651; H03M 1/0678; H03M 1/08;

(Continued)

(56) References Cited

U.S. PATENT DOCUMENTS 8,508,400 B2    8/2013  Wu
9,319,059 B1 *  4/2016  Sharma ................. H03M 1/403
(Continued)

FOREIGN PATENT DOCUMENTS

CN   102843140 B   6/2015
TW   201301773 A   1/2013
TW   201414211 A   4/2014

OTHER PUBLICATIONS

J. Tsai et al., "A 0.003 mm2 10 b 240 MS/s 0.7 mW SAR ADC in 28 nm CMOS With Digital Error Correction and Correlated-Reversed Switching," in IEEE Journal of Solid-State Circuits, vol. 50, No. 6, pp. 1382-1398, Jun. 2015, doi: 10.1109/JSSC.2015.2413850.

(Continued)

*Primary Examiner* — Linh V Nguyen
(74) *Attorney, Agent, or Firm* — Winston Hsu

(57) ABSTRACT

A method of operating an analog-to-digital converter includes in a first sampling stage, switching a swap signal to a first level for a first selection circuit to reset a first capacitor array according to a first voltage configuration and for a second selection circuit to reset a second capacitor array according to the first voltage configuration, and in a second sampling stage, switching the swap signal to a second level for the first selection circuit to reset the first capacitor array according to the second voltage configuration and for the second selection circuit to reset the second capacitor array according to the second voltage configuration. A control logic circuit is used to switch the swap signal between the first level and the second level in a uniform order in a plurality of sampling stages.

15 Claims, 7 Drawing Sheets

(58) Field of Classification Search
CPC .... H03M 1/0836; H03M 1/10; H03M 1/1038;
H03M 1/1042; H03M 1/1047; H03M
1/1057; H03M 1/1071; H03M 1/12;
H03M 1/1295; H03M 1/201; H03M
1/403; H03M 1/442; H03M 1/46; H03M
1/56; H03M 3/338; H03M 3/37; H03M
3/378; H03M 3/412; H03M 3/424; H03M
3/426; H03M 3/458
USPC .......................................... 341/155, 161, 163
See application file for complete search history.

(56) References Cited

U.S. PATENT DOCUMENTS

| | | | | |
|---|---|---|---|---|
| 9,461,665 | B1* | 10/2016 | Kim | H03M 1/462 |
| 9,712,181 | B1* | 7/2017 | Chen | H03M 1/68 |
| 2010/0194619 | A1* | 8/2010 | Ohnhaeuser | H03M 1/002 |
| | | | | 341/159 |
| 2013/0076546 | A1* | 3/2013 | Wan | H03M 1/1033 |
| | | | | 341/120 |
| 2014/0085118 | A1 | 3/2014 | Tsai | |
| 2018/0091163 | A1* | 3/2018 | Fan | H03M 1/002 |
| 2018/0091165 | A1* | 3/2018 | Chen | H03M 1/466 |
| 2020/0195266 | A1* | 6/2020 | Chao | H03M 1/1033 |
| 2021/0313998 | A1* | 10/2021 | Wang | H04B 1/40 |

OTHER PUBLICATIONS

M. Wu, Y. Chung and H. Li, "A 12-bit 8.47-fJ/conversion-step 1-MS/s SAR ADC using capacitor-swapping technique," 2012 IEEE Asian Solid-State Circuits Conference (A-SSCC), Kobe, 2012, pp. 157-160, doi: 10.1109/IPEC.2012.6522649 ,Nov. 2012.

\* cited by examiner

ANALOG-TO-DIGITAL CONVERTER AND METHOD OF OPERATING SAME

CROSS REFERENCE TO RELATED APPLICATION

This non-provisional application claims priority of Taiwan patent application No. 110112713, filed on 8 Apr. 2021, included herein by reference in its entirety.

BACKGROUND OF THE INVENTION

1. Field of the Invention

The present invention relates to electronic circuits, in particular, to an analog-to-digital converter and an operating method thereof.

2. Description of the Prior Art

An analog-to-digital converter (ADC) is a device for converting a continuous signal in analog form into a discrete signal in digital form. Analog-to-digital converters have been widely adopted in audio systems, video systems, communication systems, and various digital signal processing systems. A successive approximation register (SAR) analog-to-digital converter employs capacitor arrays for analog-to-digital conversion, being low in power consumption and suitable for mobile devices and portable devices. However, the mismatch between the capacitances in the capacitor arrays of the SAR ADC will give rise to nonlinearity errors of the SAR ADC and reduce the accuracy of the SAR ADC.

SUMMARY OF THE INVENTION

According to an embodiment of the invention, an analog-to-digital converter includes a first capacitor array, a first selection circuit, a second capacitor array, a second selection circuit and a control logic circuit. The first capacitor array includes a plurality of sets of capacitors, each set of capacitors of the first capacitor array comprising a first capacitor and a second capacitor. The second capacitor array includes a plurality of sets of capacitors, each set of capacitors of the second capacitor array comprising a first capacitor and a second capacitor. The first selection circuit is coupled to the first capacitor array. The second selection circuit is coupled to the second capacitor array. The control logic circuit is coupled to the first selection circuit and the second selection circuit. A method of operating an analog-to-digital converter includes in a first sampling stage, switching a switching signal to a first level for the first selection circuit to output a first reference voltage to the first capacitor in each set of capacitors of the first capacitor array and output a second reference voltage to the second capacitor in each set of capacitors of the first capacitor array, and for the second selection circuit to output the first reference voltage to the first capacitor in each set of capacitors of the second capacitor array and output the second reference voltage to the second capacitor in each set of capacitors of the second capacitor array. The method further includes in a second sampling stage, switching a switching signal to a second level for the first selection circuit to output the second reference voltage to the first capacitor in each set of capacitors of the first capacitor array and output the first reference voltage to the second capacitor in each set of capacitors of the first capacitor array, and for the second selection circuit to output the second reference voltage to the first capacitor in each set of capacitors of the second capacitor array and output the first reference voltage to the second capacitor in each set of capacitors of the second capacitor array. The control logic circuit switches the switching signal between the first level and the second level according to a uniform sequence during a plurality of sampling stages. The first level and the second level are different from each other.

According to another embodiment of the invention, an analog-to-digital converter includes a first selection circuit, a second selection circuit, a first capacitor array, a second capacitor array, a comparator and a control logic circuit. The first capacitor array is coupled to the first selection circuit, and includes a plurality of capacitors, each capacitor of the first capacitor array including a first capacitor and a second capacitor. The second capacitor array is coupled to the second selection circuit, and includes a plurality of capacitors, each capacitor of the second capacitor array including a first capacitor and a second capacitor. The comparator comprising a first input terminal coupled to the first capacitor array, a second input terminal coupled to the second capacitor array, and an output terminal. The control logic circuit is coupled to the output terminal of the comparator, the first selection circuit and the second selection circuit. In a first sampling stage, the control logic circuit is configured to switch a switching signal to a first level for the first selection circuit to output a first reference voltage to the first capacitor in each set of capacitors of the first capacitor array and output a second reference voltage to the second capacitor in each set of capacitors of the first capacitor array, and for the second selection circuit to output the first reference voltage to the first capacitor in each set of capacitors of the second capacitor array and output the second reference voltage to the second capacitor in each set of capacitors of the second capacitor array. In a second sampling stage, the control logic circuit is configured to switch a switching signal to a second level for the first selection circuit to output the second reference voltage to the first capacitor in each set of capacitors of the first capacitor array and output the first reference voltage to the second capacitor in each set of capacitors of the first capacitor array, and for the second selection circuit to output the second reference voltage to the first capacitor in each set of capacitors of the second capacitor array and output the first reference voltage to the second capacitor in each set of capacitors of the second capacitor array. The control logic circuit is configured to switch the switching signal between the first level and the second level according to a uniform sequence during a plurality of sampling stages, and the first level and the second level are different from each other.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
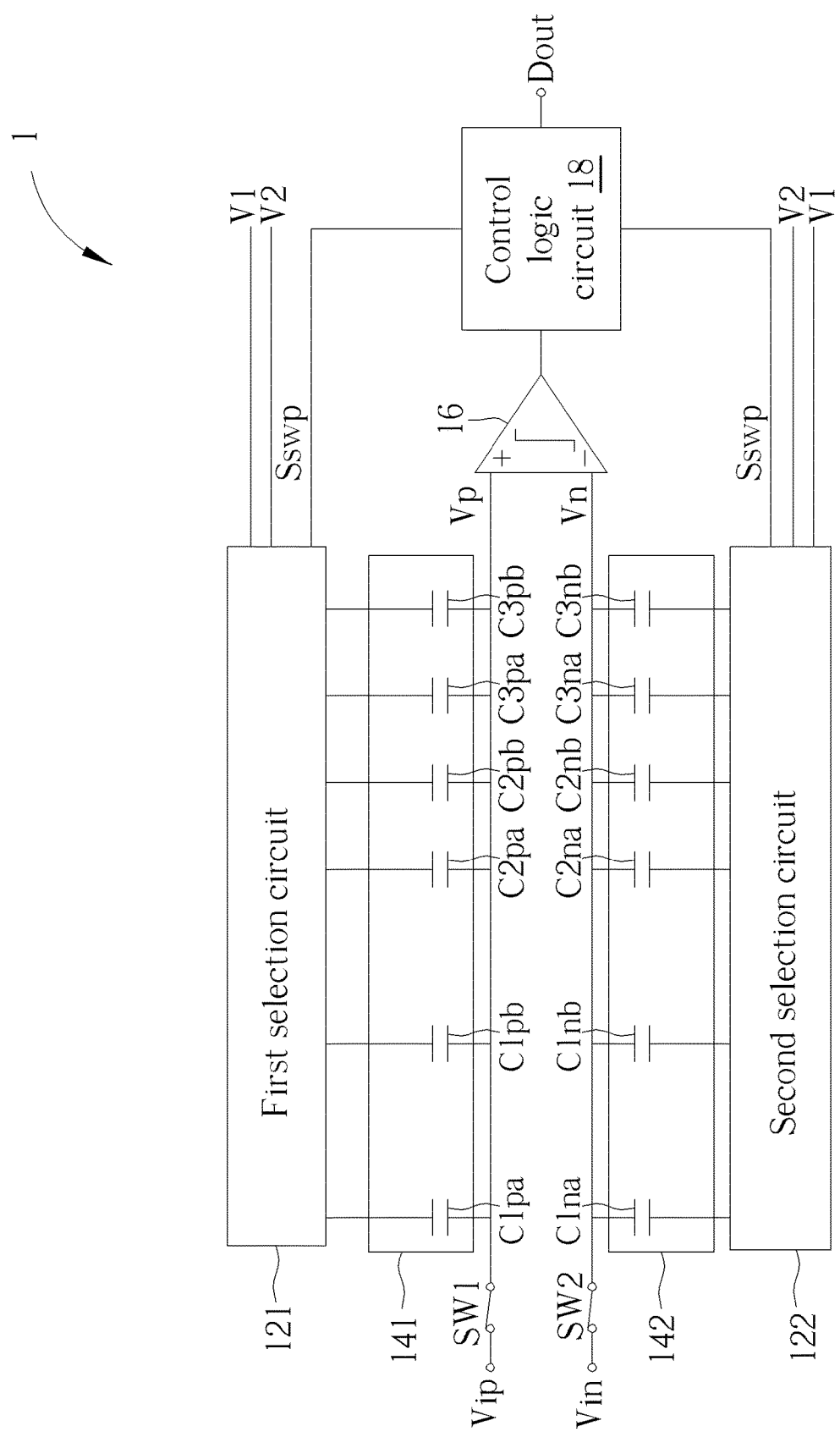
FIG. 1A is a circuit schematic of an analog-to-digital converter according to an embodiment of the invention.

FIG. 1A is a circuit schematic of an analog-to-digital converter 1 according to an embodiment of the invention. The analog-to-digital converter 1 is a 3-bit split-capacitor type successive approximation register (SAR) analog-to-digital converter (ADC), and can be used to convert differential input voltages Vip, Vin into digital output data Dout according to a successive approximation method such as a binary search method. The differential input voltages Vip, Vin may be provided by a first signal source and a second signal source, respectively. The digital output data Dout may include 3 bits. The analog-to-digital converter 1 may generate a set of digital output data Dout in each operation cycle. Each operation cycle may include a sampling stage (or referred to as an acquisition stage) and a quantization stage (or referred to as a conversion stage). The analog-to-digital converter 1 may sample the differential input voltages Vip, Vin in the sampling stage to generate a pair of sampled signals, and quantize the pair of sampled signals in the quantization stage to generate the digital output data Dout. The quantization stage may include multiple (3) conversions to sequentially generate multiple (3) bits of the digital output data Dout. In a plurality of sampling stages, the analog-to-digital converter 1 may be reset according to two voltage settings, thereby reducing a voltage error owing to a mismatch between capacitive components, reducing an integral nonlinearity (INL) error and a differential nonlinearity (DNL) error, while providing a high-speed analog-to-digital conversion.

The analog-to-digital converter 1 may include a switch SW1 and a switch SW2, a first capacitor array 141, a first selection circuit 121, a second capacitor array 142, a second selection circuit 122, a comparator 16 and a control logic circuit 18. The first selection circuit 121 and the switch SW1 are coupled to the first capacitor array 141. The second selection circuit 122 and the switch SW2 are coupled to the second capacitor array 142. The comparator 16 may include a first input terminal coupled to the first capacitor array 141, a second input terminal coupled to the second capacitor array 142, and an output terminal coupled to the control logic circuit 18. The control logic circuit 18 is coupled to the first selection circuit 121 and the second selection circuit 122.

The first capacitor array 141 may include 3 sets of capacitors. The capacitances of the 3 sets of capacitors may be different. Each set of capacitors includes a first capacitor and a second capacitor, and the first capacitor and the second capacitor have substantially equal capacitances. The first set of capacitors of the first capacitor array 141 may include a first capacitor C1pa and a second capacitor C1pb, the second set of capacitors may include a first capacitor C2pa and a second capacitor C2pb, and the third set of capacitors may include a first capacitor C3pa and a second capacitor C3pb. The first set of capacitors, the second set of capacitors, and the third set of capacitors of the first capacitor array 141 may respectively correspond to the most significant bit (MSB) to the least significant bit (LSB) of the digital output data Dout. Each of the first capacitor C1pa and the second capacitor C1pb may have substantially equal capacitances of 3C, and the first set of capacitors of the first capacitor array 141 may have a capacitance of 6C. Each of the first capacitor C2pa and the second capacitor C2pb may have substantial equal capacitances of 2C, and the second set of capacitors of the first capacitor array 141 may have a capacitance of 4C. Each of the first capacitor C1pa and the second capacitor C1pb may have substantially equal capacitances of C, respectively, and the third set of capacitors of the first capacitor array 141 may have a capacitance of 2C. Each of the capacitors C1pa, C1pb, C2pa, C2pb, C3pa, C3pb may include an upper plate and a lower plate. The upper plates of the capacitors C1pa, C1pb, C2pa, C2pb, C3pa, C3pb may be coupled to the switch SW1.

Similarly, the second capacitor array 142 may include 3 sets of capacitors. The capacitances of the 3 sets of capacitors may be different. Each set of capacitors includes a first capacitor and a second capacitor, and the first capacitor and the second capacitor have substantially equal capacitances. The first set of capacitors of the second capacitor array 142 may include a first capacitor C1na and a second capacitor C1nb, the second set of capacitors may include a first capacitor C2na and a second capacitor C2nb, and the third set of capacitors may include a first capacitor C3na and a second capacitor C3nb. The first set of capacitors, the second set of capacitors, and the third set of capacitors of the second capacitor array 142 may respectively correspond to the most significant bit to the least significant bit of the digital output data Dout. Each of the first capacitor C1na and the second capacitor C1nb may have substantially equal capacitances of 3C, and the first set of capacitors of the second capacitor array 142 may have a capacitance of 6C. Each of the first capacitor C2na and the second capacitor C2nb may have substantial equal capacitances of 2C, and the second set of capacitors of the second capacitor array 142 may have a capacitance of 4C. Each of the first capacitor C1pa and the second capacitor C1pb may have substantially equal capacitances of C, and the third set of capacitors of the second capacitor array 142 may have a capacitance of 2C. Each of the capacitors C1na, C1nb, C2na, C2nb, C3na, C3nb may include an upper plate and a lower plate. The upper plates of the capacitors C1na, C1nb, C2na, C2nb, C3na, C3nb may be coupled to the switch SW2.

The first selection circuit 121 may receive the first reference voltage V1 and the second reference voltage V2 to configure the 3 sets of capacitors of the first capacitor array 141, and the second selection circuit 122 may receive the first reference voltage V1 and the second reference voltage V2 to configure the 3 sets of capacitors of the second capacitor array 142. In some embodiments, the first reference voltage V1 may be a supply voltage such as 1.8V, and the second reference voltage V2 may be a ground voltage such as 0V. In other embodiments, the first reference voltage V1 may be a ground voltage, and the second reference voltage V2 may be a supply voltage. The first selection circuit 121 may be coupled to the lower plates of the capacitors C1pa, C1pb, C2pa, C2pb, C3pa, and C3pb. The second selection circuit 122 may be coupled to the lower plates of the capacitors C1na, C1nb, C2na, C2nb, C3na, and C3nb.

Figure 1B:
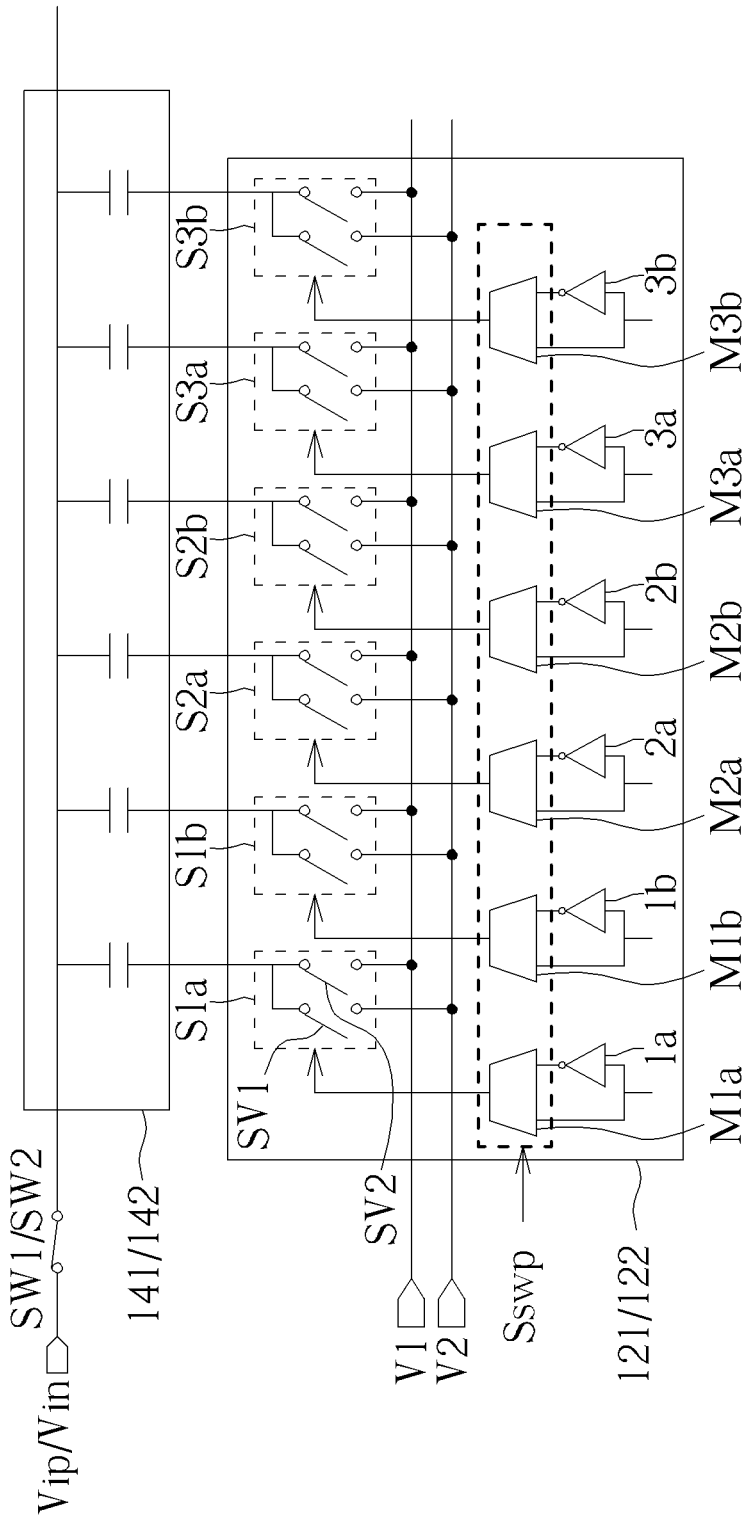
FIG. 1B is a circuit schematic of the first selection circuit and/or the second selection circuit in FIG. 1A.

The first selection circuit 121 and the second selection circuit 122 may be implemented by one or more switches coupled to the reference voltages V1, V2 and one or more multiplexers, but are not limited thereto. FIG. 1B is a schematic circuit diagram of an embodiment of the first selection circuit 121 or the second selection circuit 122. Explanation will be made with reference to the first selection circuit 121 as follows. The second selection circuit 122 may be configured and operated according to a principle similar to the first selection circuit 121. The first selection circuit 121 may include inverters 1a, 1b, 2a, 2b, 3a, 3b, multiplexers M1a, M1b, M2a, M2b, M3a, M3b, and switch circuits S1a, S1b, S2a, S2b, S3a, S3b. The inverters 1a, 1b, 2a, 2b, 3a, 3b may be coupled to the control logic circuit 18 and may be coupled to the multiplexers M1a, M1b, M2a, M2b, M3a, M3b, respectively. The multiplexers M1a, M1b, M2a, M2b, M3a, and M3b may be coupled to the control logic circuit 18 and may be coupled to the switch circuits S1a, S1b, S2a, S2b, S3a, and S3b, respectively. The switch circuits S1a, S1b, S2a, S2b, S3a, and S3b may be coupled to the lower plates of the capacitors C1pa, C1pb, C2pa, C2pb, C3pa, and C3pb of the first capacitor array 141, respectively.

The inverters 1a, 1b, 2a, 2b, 3a, and 3b may receive corresponding selection signals from the control logic circuit 18, respectively. The multiplexers M1a, M1b, M2a, M2b, M3a, and M3b may receive the corresponding selection signals from the control logic circuit 18 and the inverses of the corresponding selection signals from the inverters 1a, 1b, 2a, 2b, 3a, and 3b, and select ones of the corresponding selection signals and the inverses thereof according to the switching signal Sswp to serve as corresponding multiplexer output signals, and output the corresponding multiplexer output signals to the switch circuits S1a, S1b, S2a, S2b, S3a, and S3b. Each of the switch circuits S1a, S1b, S2a, S2b, S3a, and S3b includes switches SV1 and SV2. The switch SV1 may receive the second reference voltage V2, and the switch SV2 may receive the first reference voltage V1. Each of the switch circuits S1a, S1b, S2a, S2b, S3a, S3b may be controlled by the corresponding multiplexer output signal of the multiplexer M1a, M1b, M2a, M2b, M3a, M3b to output the first reference voltage V1 or the second reference Voltage V2.

Referring to FIG. 1A, during the sampling stage, the switch SW1 and the switch SW2 may be turned on, and the first capacitor array 141 and the second capacitor array 142 may sample the differential input voltages Vip, Vin, respectively. The control logic circuit 18 may generate the switching signal Sswp, and may switch the switching signal Sswp between the first level and the second level according to a uniform sequence during the plurality of sampling stages, and the first level and the second level are different from each other. The first level may be a logic "0", and the second level may be a logic "1". The uniform sequence may be an alternating sequence, a random sequence, or other predetermined sequences. When the uniform sequence is an alternating sequence, the control logic circuit 18 may switch the switching signal Sswp between the first level and the second level alternately. When the uniform sequence is a random sequence, the control logic circuit 18 may randomly switch the switching signal Sswp between the first level and the second level, and the probabilities of switching the signal Sswp to the first level or the second level are substantially equal. The other predetermined sequences may be non-alternating or non-random sequences. For example, the predetermined sequence may include switching the switching signal Sswp to the first level for N sampling stages, and then switching the switching signal Sswp to the second level for subsequent N sampling stages. In other embodiments, the switching signal Sswp may be switched to the first level or the second level according to pre-sampled information, so as to generate the predetermined sequence. In the sampling stage, the first selection circuit 121 and the second selection circuit 122 may output the voltages in the first voltage setting or the second voltage setting to the capacitors C1pa, C1pb, C2pa, C2pb, C3pa, C3pb and the capacitors C1na, C1nb, C2na, C2nb, C3na, C3nb. Tables 1 and 2 show the first voltage setting and the second voltage setting, respectively:

TABLE 1

| Capacitor | C1pa | C1pb | C2pa | C2pb | C3pa | C3pb |
|---|---|---|---|---|---|---|
| Lower plate voltage | V1 | V2 | V1 | V2 | V1 | V2 |
| Capacitor | C1na | C1nb | C2na | C2nb | C3na | C3nb |
| Lower plate voltage | V1 | V2 | V1 | V2 | V1 | V2 |

TABLE 2

| Capacitor | C1pa | C1pb | C2pa | C2pb | C3pa | C3pb |
|---|---|---|---|---|---|---|
| Lower plate voltage | V2 | V1 | V2 | V1 | V2 | V1 |
| Capacitor | C1na | C1nb | C2na | C2nb | C3na | C3nb |
| Lower plate voltage | V2 | V1 | V2 | V1 | V2 | V1 |

When the switching signal Sswp is set to the first level during sampling, the first selection circuit 121 may output the corresponding voltages in the first voltage setting to the lower plates of the capacitors C1pa, C1pb, C2pa, C2pb, C3pa, C3pb, and the switch SW1 may be turned on to transmit the differential input voltage Vip to the upper plates of the capacitors C1pa, C1pb, C2pa, C2pb, C3pa, C3pb, so as to establish a voltage Vp at the first input terminal of the comparator 16; the second selection circuit 122 may output the corresponding voltage in the first voltage setting to the lower plates of the capacitors C1na, C1nb, C2na, C2nb, C3na, C3nb, and the switch SW2 may be turned on to transmit the differential input voltage Vin to the upper plates of the capacitors C1na, C1nb, C2na, C2nb, C3na, C3nb, so as to establish a voltage Vn at the second input terminal of the comparator 16. When the switching signal Sswp is set to the second level during sampling, the first selection circuit 121 may output the corresponding voltages in the second voltage setting to the lower plates of the capacitors C1pa, C1pb, C2pa, C2pb, C3pa, C3pb, and the switch SW1 may be turned on to transmit the differential input voltage Vip to the upper plates of the capacitors C1pa, C1pb, C2pa, C2pb, C3pa, C3pb, so as to establish a voltage Vp; the second selection circuit 122 may output the corresponding voltage in the second voltage setting to the lower plates of the capacitors C1na, C1nb, C2na, C2nb, C3na, C3nb, and the switch SW2 may be turned on to transmit the differential input voltage Vin to the upper plates of the capacitors C1na, C1nb, C2na, C2nb, C3na, C3nb, so as to establish a voltage Vn.

In other embodiments, when the switching signal Sswp is set at the first level, the first selection circuit 121 may output the corresponding voltages in the second voltage setting to the lower plates of the capacitors C1pa, C1pb, C2pa, C2pb, C3pa, C3pb, and switch SW1 may be turned on to transmit the differential input voltage Vip to the upper plates of the capacitors C1pa, C1pb, C2pa, C2pb, C3pa, C3pb, so as to establish a voltage Vp; the second selection circuit 122 may output the corresponding voltage in the second voltage setting to the lower plates of the capacitors C1na, C1nb, C2na, C2nb, C3na, C3nb, and the switch SW2 may be turned on to transmit the differential input voltage Vin to the upper plates of the capacitors C1na, C1nb, C2na, C2nb, C3na, C3nb, so as to establish a voltage Vn. When the switching signal Sswp is set at the second level, the first selection circuit 121 may output the corresponding voltages in the first voltage setting to the lower plates of the capacitors C1pa, C1pb, C2pa, C2pb, C3pa, C3pb, and switch SW1 may be turned on to transmit the differential input voltage Vip to the upper plates of the capacitors C1pa, C1pb, C2pa, C2pb, C3pa, C3pb, so as to establish a voltage Vp; the second selection circuit 122 may output the corresponding voltage in the first voltage setting to the lower plates of the capacitors C1na, C1nb, C2na, C2nb, C3na, C3nb, and the switch SW2 may be turned on to transmit the differential input voltage Vin to the upper plates of the capacitors C1na, C1nb, C2na, C2nb, C3na, C3nb, so as to establish a voltage Vn.

In the quantization stage, the analog-to-digital converter 1 may perform 3 conversions to generate the 3 bits of the digital output data Dout. The comparator 16 may compare the voltages Vp and Vn to generate 3 comparison results, and the control logic circuit 18 may store each comparison result as one bit of the digital output data Dout, and generate selection signals according to each comparison result, so as to set the multiplexers M1pa, M1pb and the multiplexers M1na, M1nb to update the voltages Vp and Vn. The comparison result may be binary "0" or binary "1". For example, when converting the most significant bit, if the voltage Vp is higher than the voltage Vn, the comparator 16 may generate a binary "1" as the comparison result, and the control logic circuit 18 may store the binary "1" as the most significant bit and generate selection signals to set the first capacitor array 141 to output the ground voltage to the lower plates of the capacitor C1pa, C1pb, so as to pull down the voltage Vp, and generate selection signals to set the second capacitor array 142 to output the supply voltage to the lower plates of the capacitors C1na and C1nb, so as to pull up the voltage Vn. The updated voltage Vp will be less than the previous voltage Vp, and the updated voltage Vn will be higher than the previous voltage Vn. If the voltage Vp is less than the voltage Vn, the comparator 16 may generate a binary "0" as the comparison result, and the control logic circuit 18 may store the binary "0" as the most significant bit and generate a selection signal to set the first capacitor array 141 to output the supply voltage to the lower plates of the capacitor C1pa, C1pb, so as to pull up the voltage Vp, and generate a selection signal to set the second capacitor array 142 to output the ground voltage to the lower plates of the capacitors C1na and C1nb, so as to pull down the voltage Vn. The updated voltage Vp will be higher than the previous voltage Vp, and the updated voltage Vn will be less than the previous voltage Vn. The analog-to-digital converter 1 may sequentially compare and update the voltages Vp and Vn to generate 3 bits of the digital output data Dout, and output the digital output data Dout for the subsequent use.

Figure 2:
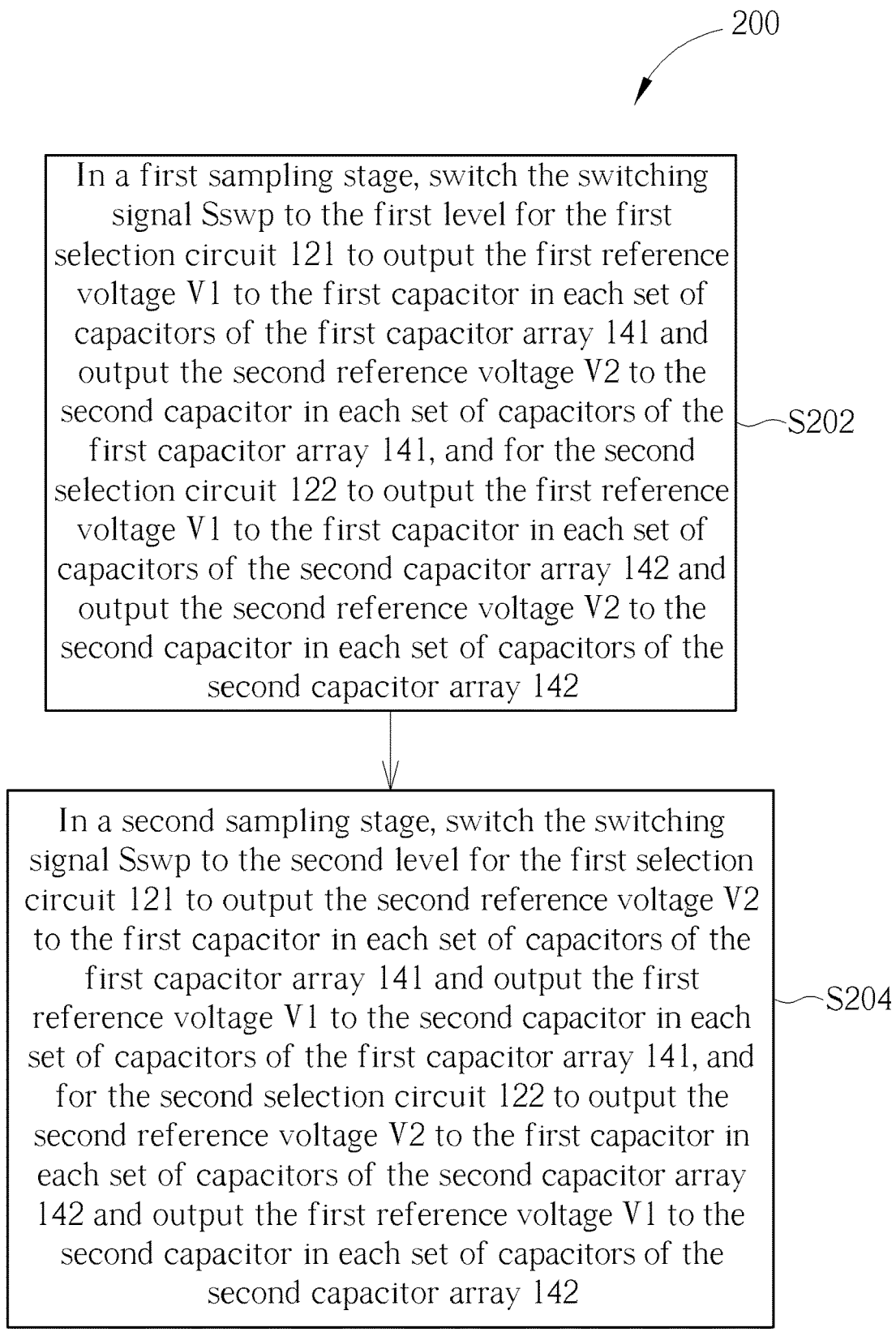
FIG. 2 is a flowchart of a method of operating the analog-to-digital converter in FIG. 1A.

FIG. 2 is a flowchart of a method 200 of operating the analog-to-digital converter 1. The method 200 includes Steps S202 and S204 for resetting the first capacitor array 141 and the second capacitor array 142 using the two voltage settings during a plurality of sampling stages. Any reasonable Step change or adjustment is within the scope of the disclosure. Steps S202 and S204 are detailed as follows:

Step S202: In a first sampling stage, switch the switching signal Sswp to the first level for the first selection circuit 121 to output the first reference voltage V1 to the first capacitor in each set of capacitors of the first capacitor array 141 and output the second reference voltage V2 to the second capacitor in each set of capacitors of the first capacitor array 141, and for the second selection circuit 122 to output the first reference voltage V1 to the first capacitor in each set of capacitors of the second capacitor array 142 and output the second reference voltage V2 to the second capacitor in each set of capacitors of the second capacitor array 142;

Step S204: In a second sampling stage, switch the switching signal Sswp to the second level for the first selection circuit 121 to output the second reference voltage V2 to the first capacitor in each set of capacitors of the first capacitor array 141 and output the first reference voltage V1 to the second capacitor in each set of capacitors of the first capacitor array 141, and for the second selection circuit 122 to output the second reference voltage V2 to the first capacitor in each set of capacitors of the second capacitor array 142 and output the first reference voltage V1 to the second capacitor in each set of capacitors of the second capacitor array 142.

The second sampling stage may be the sampling stage directly after the first sampling stage, or may be separated from the first sampling stage by several sampling stages. The method 200 is explained below with reference to the analog-to-digital converter 1.

In the first sampling stage, the control logic circuit 18 switches the switching signal Sswp to the first level, and the first selection circuit 121 outputs the first reference voltage V1 to the first capacitor C1pa of the first set of capacitors, the first capacitor C2pa of the second set of capacitors and the first capacitor C3pa of the third set of capacitors of the first capacitor array 141, and outputs the second reference voltage V2 to the second capacitor C1pb of the first set of capacitors, the second capacitor C2pb of the second set of capacitors and the second capacitor C3pb of the third set of capacitors of the first capacitor array 141, and the second selection circuit 122 outputs the first reference voltage V1 to the first capacitor C1na of the first set of capacitors, the first capacitor C2na of the second set of capacitors and the first capacitor C3na of the third set of capacitors of the second capacitor array 142, and outputs the second reference voltage V2 to the second capacitor C1nb of the first set of capacitors, the capacitor C2nb of the second set of capacitors and the second capacitor C3nb of the third set of capacitors of the second capacitor array 142, as indicated in the first voltage setting in Table 1 (Step S202).

In the second sampling stage, the control logic circuit 18 switches the switching signal Sswp to the second level, and the first selection circuit 121 outputs the second reference voltage V2 to the first capacitor C1pa of the first set of capacitors, the first capacitor C2pa of the second set of capacitors and the first capacitor C3pa of the third set of capacitors of the first capacitor array 141, and outputs the first reference voltage V1 to the second capacitor C1pb of the first set of capacitors, the second capacitor C2pb of the second set of capacitors and the second capacitor C3pb of the third set of capacitors of the first capacitor array 141, and the second selection circuit 122 outputs the second reference voltage V2 to the first capacitor C1na of the first set of the capacitors, the first capacitor C2na of the second set of capacitors and the first capacitor C3na of the third set of capacitors of the second capacitor array 142, and outputs the first reference voltage V1 to the second capacitor C1nb of the first set of capacitors, the second capacitor C2nb of the second set of capacitors and the second capacitor C3nb of the third set of capacitors of the second capacitor array 142, as indicated in the second voltage setting in Table 2 (Step S204).

Figure 3A:
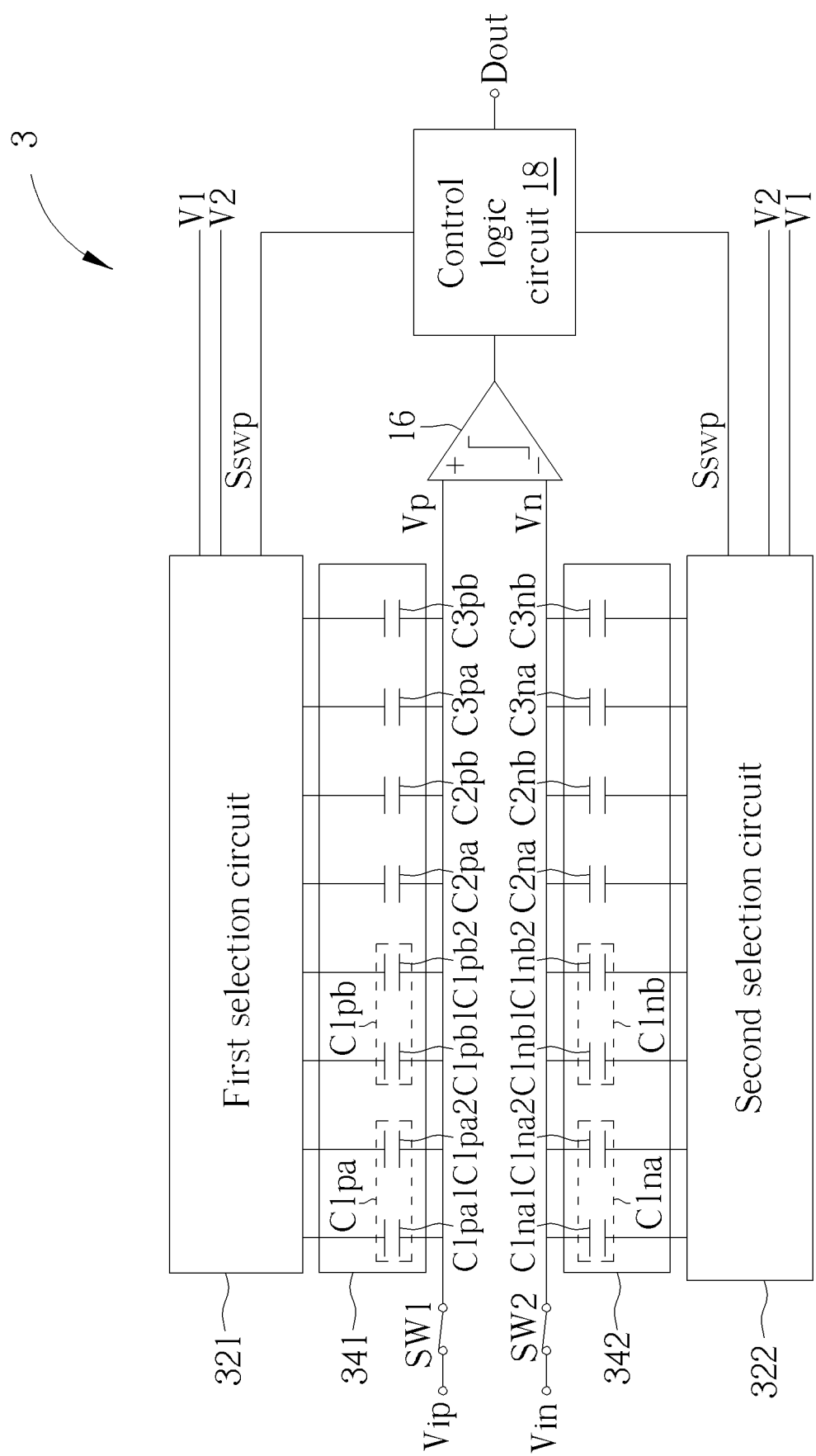
FIG. 3A is a circuit schematic of an analog-to-digital converter according to another embodiment of the present invention.

FIG. 3A is a circuit schematic of an analog-to-digital converter 3 according to another embodiment of the present invention. The difference between the analog-to-digital converter 3 and the analog-to-digital converter 1 lies in that the first capacitor C1pa of the first set of capacitors of the first capacitor array 341 of the analog-to-digital converter 3 is further split into a first capacitor portion C1pa1 and a second capacitor portion C1pa2, the first capacitor C1na of the first set of capacitors of the second capacitor array 342 of the first selection circuit 321 is further split into a first capacitor portion C1na1 and a second capacitor portion C1na2.

Figure 3B:
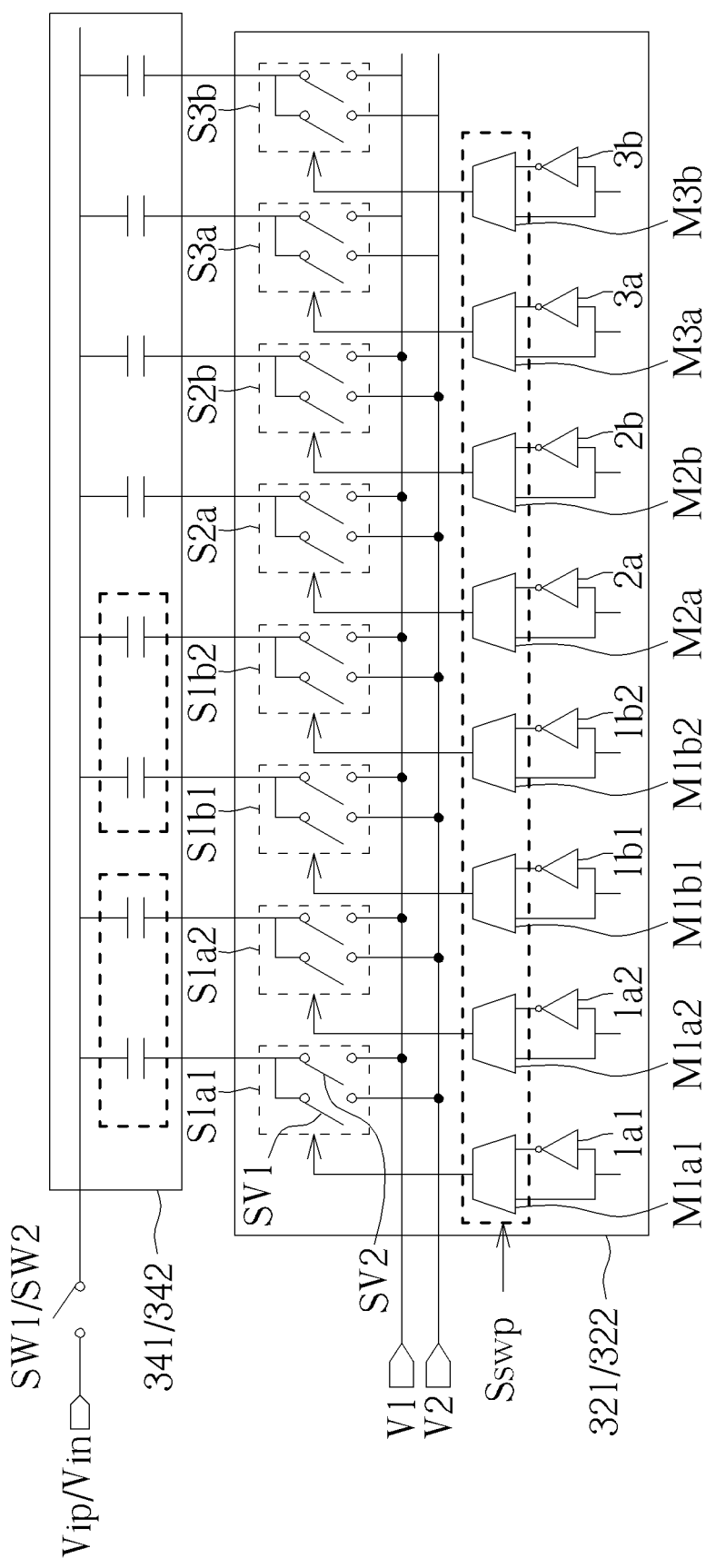
FIG. 3B is a circuit schematic of the first selection circuit and/or the second selection circuit in FIG. 3A.

The first selection circuit 321 and the second selection circuit 322 may be implemented by one or more switches coupled to the reference voltages V1, V2 and one or more multiplexers, but are not limited thereto. FIG. 3B is a schematic circuit diagram of an embodiment of the first selection circuit 321 or the second selection circuit 322. Explanation below will be made with reference to the first selection circuit 321. The second selection circuit 322 may be configured and operated according to a principle similar to the first selection circuit 321. The first selection circuit 321 may include inverters 1a1, 1a2, 1b1, 1b2, 2a, 2b, 3a, 3b, multiplexers M1a1, M1a2, M1b1, M1b2, M2a, M2b, M3a, M3b, and switch circuits S1a1, S1a2, S1b1, S1b2, S2a, S2b, S3a, S3b. The inverters 1a1, 1a2, 1b1, 1b2, 2a, 2b, 3a, 3b may be coupled to the control logic circuit 18 and may be coupled to the multiplexers M1a1, M1a2, M1b1, M1b2, M2a, M2b, M3a, M3b, respectively. The multiplexers M1a1, M1a2, M1b1, M1b2, M2a, M2b, M3a, M3b may be coupled to the control logic circuit 18 and may be coupled to the switch circuits S1a1, S1a2, S1b1, S1b2, S2a, S2b, S3a, S3b, respectively. The switch circuits S1a1, S1a2, S1b1, S1b2, S2a, S2b, S3a, S3b may be coupled to the lower plates of the capacitors C1pa1, C1pa2, C1pb1, C1pb2, C2pa, C2pb, C3pa, C3pb of the first capacitor array 341, respectively.

The inverters 1a1, 1a2, 1b1, 1b2, 2a, 2b, 3a, 3b may receive corresponding selection signals from the control logic circuit 18, respectively. The multiplexers M1a1, M1a2, M1b1, M1b2, M2a, M2b, M3a, M3b may receive the corresponding selection signals from the control logic circuit 18 and inverses of the corresponding selection signals from the inverters 1a1, 1a2, 1b1, 1b2, 2a, 2b, 3a, 3b, and select ones of the corresponding selection signals and the inverses of the corresponding selection signal according to the switching signal Sswp to serve as corresponding multiplexer output signals, and output the corresponding multiplexer output signals to the switch circuits S1a1, S1a2, S1b 1, S1b2, S2a, S2b, S3a, S3b. Each of the switch circuits S1a1, S1a2, S1b1, S1b2, S2a, S2b, S3a, S3b includes switches SV1 and SV2. The switch SV1 may receive the second reference voltage V2, and the switch SV2 may receive the first reference voltage V1. Each of the switch circuits S1a1, S1a2, S1b1, S1b2, S2a, S2b, S3a, S3b may be controlled by the corresponding multiplexer output signals of the multiplexer M1a1, M1a2, M1b1, M1b2, M2a, M2b, M3a, M3b to output the first reference voltage V1 or the second reference voltage V2.

The capacitance of the first capacitor portion of the first capacitor of a set of larger capacitors of the first capacitor array 341 may be substantially equal to a capacitance of the first capacitor of a set of smaller capacitors of the first capacitor array 341; and the capacitance of the first capacitor portion of the second capacitor of the set of larger capacitors of the first capacitor array 341 may be substantially equal to the capacitance of the first capacitor of the set of smaller capacitors of the first capacitor array 341. For example, the capacitance of the first capacitor portion C1pa1 of the first capacitor C1pa of the first set of capacitors of the first capacitor array 341 may be substantially equal to the capacitance "2C" of the first capacitor C2pa of the second set of capacitors of the first capacitor array 341; and the capacitance of the first capacitor portion C1pb 1 of a second capacitor C1pb of the first set of capacitors of the first capacitor array 341 may be substantially equal to the capacitance "2C" of the first capacitor C2pa of the second set of capacitors of the first capacitor array 341. The capacitance of the second capacitor portion of the first capacitor of the set of larger capacitors of the first capacitor array 341 may be equal to the remaining capacitance of the first capacitor of the set of larger capacitors except for the first capacitor portion. For example, the capacitance of the second capacitor portion C1pa2 of the first capacitor C1pa of the first capacitor array 341 may be equal to 1C.

The capacitance of the first capacitor portion of the first capacitor of a set of larger capacitors of the second capacitor array 342 may be substantially equal to a capacitance of the first capacitor of a set of smaller capacitors of the second capacitor array 342; and the capacitance of the first capacitor portion of the second capacitor of the set of larger capacitors of the second capacitor array 342 may be substantially equal to the capacitance of the first capacitor of the set of smaller capacitors of the second capacitor array 342. For example, the capacitance of the first capacitor portion C1na1 of the first capacitor C1na of the first set of capacitors of the second capacitor array 342 may be substantially equal to the capacitance "2C" of a first capacitor C2na of the second set of capacitors of the second capacitor array 342; and the capacitance of the first capacitor portion C1nb1 of a second capacitor C1nb of the first set of capacitors of the second capacitor array 342 may be substantially equal to the capacitance "2C" of the first capacitor C2na of the second set of capacitors of the second capacitor array 342. The capacitance of the second capacitor portion of the first capacitor of the set of larger capacitors of the second capacitor array 342 may be equal to the remaining capacitance of the first capacitor of the set of larger capacitors except for the first capacitor portion. For example, the capacitance of the second capacitor portion C1na2 of the first capacitor C1na of the second capacitor array 342 may be equal to 1C.

The differences between the analog-to-digital converter 3 and the analog-to-digital converter 1 are explained as follows.

In the sampling stage, the first selection circuit 321 and the second selection circuit 322 may output the voltage in the first voltage setting or the second voltage setting to the capacitors C1pa1, C1pa2, C1pb1, C1pb2, C2pa, C2pb, C3pa, C3pb and capacitors C1na1, C1na2, C1nb1, C1nb2, C2na, C2nb, C3na, C3nb according to the switching signal Sswp. Table 3 and Table 4 respectively show the first voltage setting and the second voltage setting:

TABLE 3

| Capacitor | C1pa1 | C1pa2 | C1pb1 | C1pb2 | C2pa | C2pb | C3pa | C3pb |
|---|---|---|---|---|---|---|---|---|
| Lower plate voltage | V1 | V1 | V2 | V2 | V1 | V2 | V1 | V2 |

TABLE 3-continued

| Capacitor | C1na1 | C1na2 | C1nb1 | C1nb2 | C2na | C2nb | C3na | C3nb |
|---|---|---|---|---|---|---|---|---|
| Lower plate voltage | V1 | V1 | V2 | V2 | V1 | V2 | V1 | V2 |

TABLE 4

| Capacitor | C1pa1 | C1pa2 | C1pb1 | C1pb2 | C2pa | C2pb | C3pa | C3pb |
|---|---|---|---|---|---|---|---|---|
| Lower plate voltage | V2 | V2 | V1 | V1 | V2 | V1 | V2 | V1 |

| Capacitor | C1na | C1na2 | C1nb1 | C1nb2 | C2na | C2nb | C3na | C3nb |
|---|---|---|---|---|---|---|---|---|
| Lower plate voltage | V2 | V2 | V1 | V1 | V2 | V1 | V2 | V1 |

The analog-to-digital converter 3 may also be adopted in the method 200. In the first sampling stage, the control logic circuit 18 switches the switching signal Sswp to the first level, and the first selection circuit 121 outputs the first reference voltage V1 to the first capacitor portion C1pa1 and the second capacitor portion C1pa2 of the first capacitor C1pa, the first capacitor C2pa of the second set of capacitors and the first capacitor C3pa of the third set of capacitors of the first set of capacitors of the first capacitor array 341, and outputs the second reference voltage V2 to the first capacitor portion C1pb1 and the second capacitor portion C1pb2 of the second capacitor C1pb of the first set of capacitors, the second capacitor C2pb of the second set of capacitors and the second capacitor C3pb of the third set of capacitors of the first capacitor array 341, the second selection circuit 122 outputs the first reference voltage V1 to the first capacitor portion C1na1 and the second capacitor portion C1na2 of the first capacitor C1na of the first set of capacitors, the first capacitor C2na of the second set of capacitors and the first capacitor C3na of the third set of capacitors of the second capacitor array 342, and outputs the second reference voltage V2 to the first capacitor portion C1nb 1 and the second capacitor portion C1nb2 of the second capacitor C1nb of the first set of capacitors, the capacitor C2nb of the second set of capacitors and the second capacitor C3nb of the third set of capacitors of the second capacitor array 342 (Step S202).

In the second sampling stage, the control logic circuit 18 switches the switching signal Sswp to the second level, and the first selection circuit 121 outputs the second reference voltage V2 to the first capacitor portion C1pa1 and the second capacitor portion C1pa2 of the first capacitor C1pa of the first set of capacitors, the first capacitor C2pa of the second set of capacitors and the first capacitor C3pa of the third set of capacitors of the first capacitor array 341, and outputs the first reference voltage V1 to the first capacitor portion C1pb 1 and the second capacitor portion C1pb2 of the second capacitor C1pb of the first set of capacitors, the second capacitor C2pb of the second set of capacitors and the second capacitor C3pb of the third set of capacitors of the first capacitor array 341, and the second selection circuit 122 outputs the second reference voltage V2 to the first capacitor portion C1na1 and the second capacitor portion C1na2 of the first capacitor C1na of the first set of the capacitors, the first capacitor C2na of the second set of capacitors and the first capacitor C3na of the third set of capacitors of the second capacitor array 342, and outputs the first reference voltage V1 to the first capacitor portion C1nb1 and the second capacitor portion C1nb2 of the second capacitor C1nb of the first set of capacitors, the second capacitor C2nb of the second set of capacitors and the second capacitor C3nb of the third set of capacitors of the second capacitor array 342 (Step S204).

Since the analog-to-digital converters 1, 3 and the operation method 200 use the first voltage setting and the second voltage setting in a uniform manner to reset the first capacitor arrays 141, 341 and the second capacitor arrays 142, 342 in a plurality of sampling stages, the transfer curve of the analog-to-digital converter is uniformly switched between the two settings, canceling out the average nonlinearity error in the digital output data Dout, and reducing the differential nonlinearity error and the integral nonlinearity error owing to the capacitance mismatch.

Figure 4A:
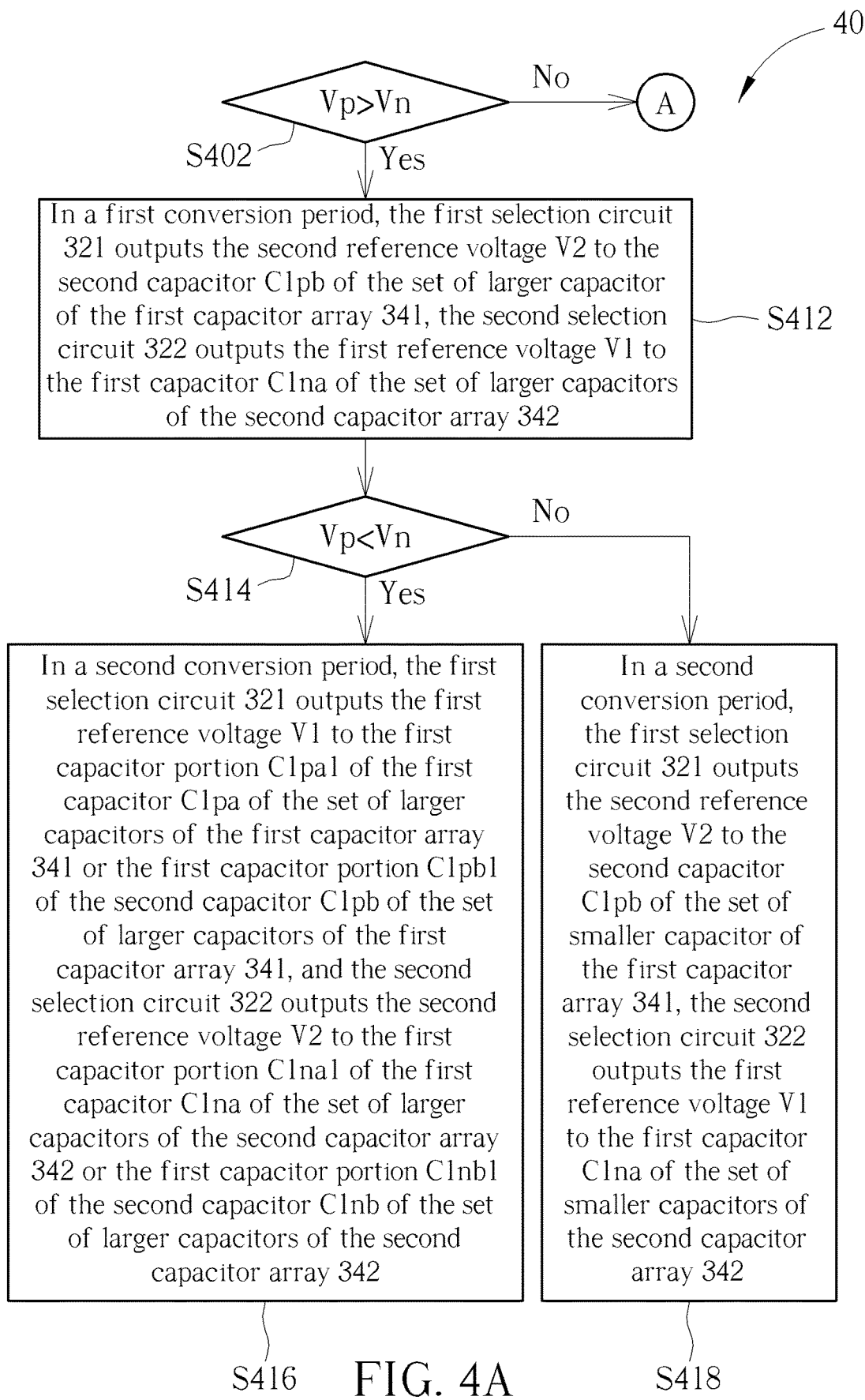
FIGS. 4A and 4B show a flowchart of a method of operating the analog-to-digital converter in FIG. 3A.
Figure 4B:
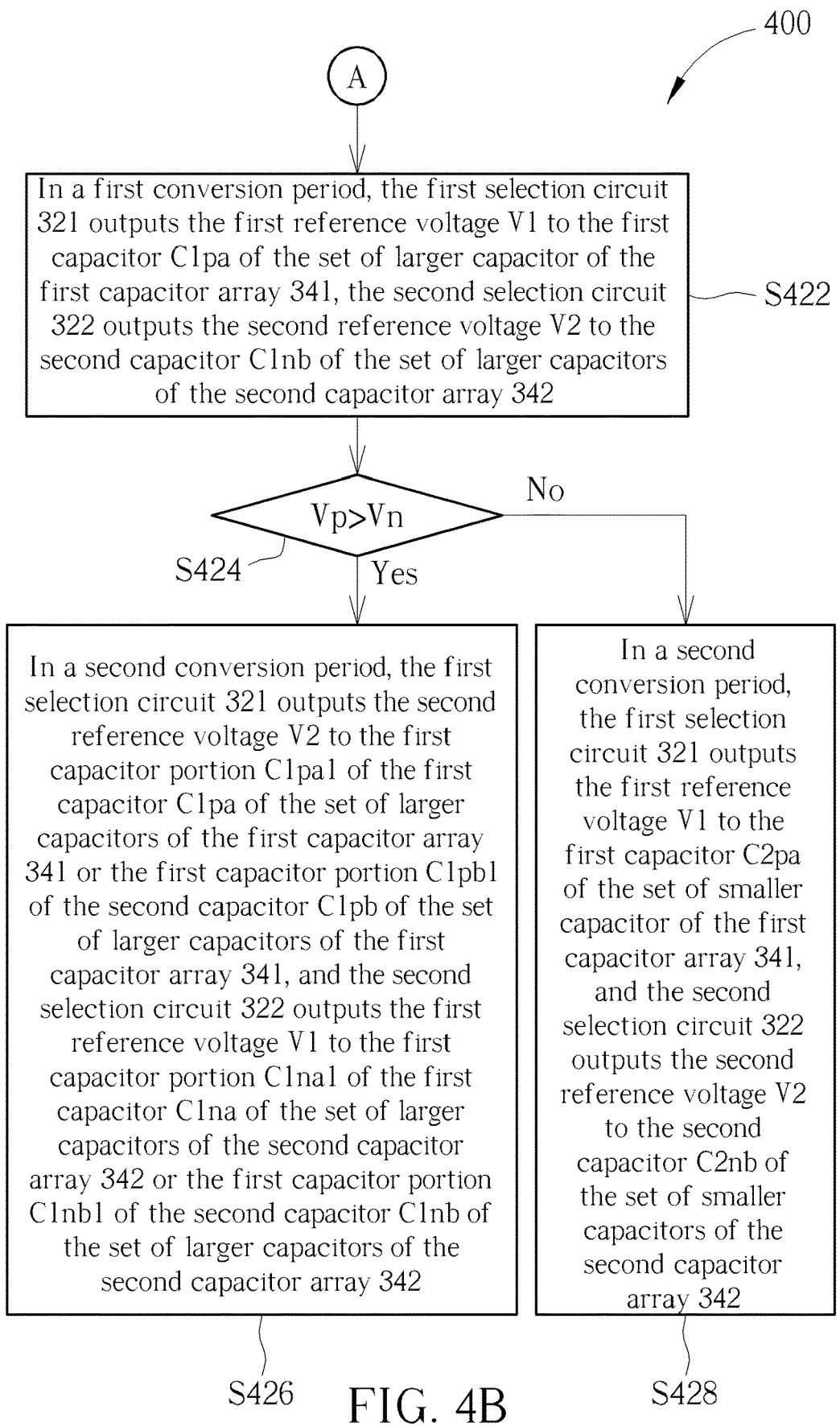

FIGS. 4A and 4B show a flowchart of a method 400 of operating the analog-to-digital converter 3. The method 400 includes Steps S402 to S428, and may be used after Step S204 of the method 200. That is, the first capacitor array 341 and the second capacitor array 342 are reset during the second sampling stage according to the second voltage setting as indicated in Table 4. Steps S402, S412, and S422 are used to set the first capacitor array 341 and the second capacitor array 342 in the first conversion period. Steps S414 to S418 and S424 to S428 are used to set the first capacitor array 341 and the second capacitor array 342 in the second conversion period. Any reasonable Step change or adjustment is within the scope of the disclosure. Steps S402 to S428 are detailed as follows:

Step S402: Determine whether the voltage Vp is higher than the voltage Vn; if so, go to Step S412; if not, go to Step S422;

Step S412: In a first conversion period, the first selection circuit 321 outputs the second reference voltage V2 to the second capacitor C1pb of the set of larger capacitor of the first capacitor array 341, the second selection circuit 322 outputs the first reference voltage V1 to the first capacitor C1na of the set of larger capacitors of the second capacitor array 342;

Step S414: Determine whether the voltage Vp is less than the voltage Vn; if so, go to Step S416; if not, go to Step S418;

Step S416: In a second conversion period, the first selection circuit 321 outputs the first reference voltage V1 to the first capacitor portion C1pa1 of the first capacitor C1pa of the set of larger capacitors of the first capacitor array 341 or the first capacitor portion C1pb1 of the second capacitor C1pb of the set of larger capacitors of the first capacitor array 341, and the second selection circuit 322 outputs the second reference voltage V2 to the first capacitor portion C1na1 of the first capacitor C1na of the set of larger capacitors of the second capacitor array 342 or the first capacitor portion C1nb1 of the second capacitor C1nb of the set of larger capacitors of the second capacitor array 342.

Step S418: In a second conversion period, the first selection circuit 321 outputs the second reference voltage V2 to the second capacitor C1pb of the set of smaller capacitor of the first capacitor array 341, the second selection circuit 322 outputs the first reference voltage V1 to the first capacitor C1na of the set of smaller capacitors of the second capacitor array 342.

Step S422: In a first conversion period, the first selection circuit 321 outputs the first reference voltage V1 to the first capacitor C1pa of the set of larger capacitor of the first capacitor array 341, the second selection circuit 322 outputs the second reference voltage V2 to the second capacitor C1nb of the set of larger capacitors of the second capacitor array 342;

Step S424: Determine whether the voltage Vp is higher than the voltage Vn; if so, go to Step S426; if not, go to Step S428;

Step S426: In a second conversion period, the first selection circuit 321 outputs the second reference voltage V2 to the first capacitor portion C1pa1 of the first capacitor C1pa of the set of larger capacitors of the first capacitor array 341 or the first capacitor portion C1pb1 of the second capacitor C1pb of the set of larger capacitors of the first capacitor array 341, and the second selection circuit 322 outputs the first reference voltage V1 to the first capacitor portion C1na1 of the first capacitor C1na of the set of larger capacitors of the second capacitor array 342 or the first capacitor portion C1nb1 of the second capacitor C1nb of the set of larger capacitors of the second capacitor array 342.

Step S428: In a second conversion period, the first selection circuit 321 outputs the first reference voltage V1 to the first capacitor C2pa of the set of smaller capacitor of the first capacitor array 341, and the second selection circuit 322 outputs the second reference voltage V2 to the second capacitor C2nb of the set of smaller capacitors of the second capacitor array 342.

The method 400 is explained as follows with reference to the analog-to-digital converter 3. The first selection circuit 321 and the second selection circuit 322 may output the voltages in the second voltage setting to the capacitors C1pa1, C1pa2, C1pb1, C1pb2, C2pa, C2pb, C3pa, C3pb and capacitors C1na1, C1na2, C1nb1, C1nb2, C2na, C2nb, C3na, C3nb in the sampling stage, as indicated in Table 4. The first reference voltage V1 may be the supply voltage and the second reference voltage V2 may be the ground voltage. After the quantization stage starts, during the first conversion period, the comparator 16 determines whether the voltage Vp is higher than the voltage Vn (Step S402).

If the voltage Vp is higher than the voltage Vn, the first selection circuit 321 outputs the second reference voltage V2 to the first capacitor portion C1pb1 and the second capacitor portion C1pb2 of the second capacitor C1pb of the first set of capacitors of the first capacitor array 341, and the second selection circuit 322 outputs the first reference voltage V1 to the first capacitor portion C1na1 and the second capacitor portion C1na2 of the first capacitor C1na of the first set of capacitors of the second capacitor array 342, as indicated in Table 5 (Step S412):

TABLE 5

| Capacitor | C1pa1 | C1pa2 | C1pb1 | C1pb2 | C2pa | C2pb | C3pa | C3pb |
|---|---|---|---|---|---|---|---|---|
| Lower plate voltage | V2 | V2 | "V2" | "V2" | V2 | V1 | V2 | V1 |

| Capacitor | C1na1 | C1na2 | C1nb1 | C1nb2 | C2na | C2nb | C3na | C3nb |
|---|---|---|---|---|---|---|---|---|
| Lower plate voltage | "V1" | "V1" | V1 | V1 | V2 | V1 | V2 | V1 |

During the second conversion period, the comparator 16 determines whether the voltage Vp is less than the voltage Vn (Step S414). If the voltage Vp is less than the voltage Vn, the first selection circuit 321 outputs the first reference voltage V1 to the first capacitor portion C1pa1 of the first capacitor C1pa of the first set of capacitors in the capacitor array 341 or the first capacitor portion C1pb1 of the second capacitor C1pb of the first set of capacitors of the first capacitor array 341, the second selection circuit 322 outputs the second reference voltage V2 to the first capacitor portion C1na1 of the first capacitor C1na of the first set of capacitors of the second capacitor array 342 or the first capacitor portion C1nb1 of the second capacitor C1nb of the first set of capacitors of the second capacitor array 342 (Step S416).

In some embodiments, the first selection circuit 321 outputs the first reference voltage V1 to the first capacitor portion C1pb1 and the second capacitor portion C1pa1 of the first capacitor C1pa of the first set of capacitors of the first capacitor array 341, and the second selection circuit 322 outputs the second reference voltage V2 to the first capacitor portion C1na1 and the second capacitor portion C1nb 1 of the second capacitor C1nb of the first set of capacitors of the second capacitor array 342, as indicated in Table 6:

TABLE 6

| Capacitor | C1pa1 | C1pa2 | C1pb1 | C1pb2 | C2pa | C2pb | C3pa | C3pb |
|---|---|---|---|---|---|---|---|---|
| Lower plate voltage | "V1" | V2 | V2 | V2 | V2 | V1 | V2 | V1 |

| Capacitor | C1na1 | C1na2 | C1nb1 | C1nb2 | C2na | C2nb | C3na | C3nb |
|---|---|---|---|---|---|---|---|---|
| Lower plate voltage | V1 | V1 | "V2" | V1 | V2 | V1 | V2 | V1 |

In other embodiments, the first selection circuit 321 may output the first reference voltage V1 to the first capacitor portion C1pb 1 and the second capacitor portion V1 of the second capacitor C1pb of the first set of capacitors of the first capacitor array 341, so as to switch the first capacitor portion C1pb1 back to the reset value thereof (V1), and the second selection circuit 322 may output the second reference voltage V2 to the first capacitor portion C1na1 and the second capacitor portion C1na1 of the first capacitor C1na of the first set of capacitors of the second capacitor array 342, so as to switch the second capacitor portion C1na1 back to the reset value thereof (V2), as indicated in Table 7 (Step S412):

TABLE 7

| Capacitor | C1pa1 | C1pa2 | C1pb1 | C1pb2 | C2pa | C2pb | C3pa | C3pb |
|---|---|---|---|---|---|---|---|---|
| Lower plate voltage | V2 | V2 | "V1" | V2 | V2 | V1 | V2 | V1 |

| Capacitor | C1na1 | C1na2 | C1nb1 | C1nb2 | C2na | C2nb | C3na | C3nb |
|---|---|---|---|---|---|---|---|---|
| Lower plate voltage | "V2" | V1 | V1 | V1 | V2 | V1 | V2 | V1 |

In other embodiments, the first selection circuit 321 and the second selection circuit 322 may respectively output the voltages of the voltage settings as indicated in Table 7 and Table 6 to the first capacitor array 341 and the second capacitor array 342 according to a uniform sequence. The uniform order may be an alternating order or a random order. When the uniform sequence is an alternating sequence, the first selection circuit 321 and the second selection circuit 322 may respectively output the voltage settings in Table 7 and Table 6 to the first capacitor array 341 and the second capacitor array 342 during a plurality of conversion periods. When the uniform sequence is a random sequence, the first selection circuit 321 and the second selection circuit 322 may randomly output the voltage settings in Table 7 and Table 6 to the first capacitor array 341 and the second capacitor array 342 during a plurality of conversion periods, respectively. The probabilities of employing the voltage settings in Table 7 and Table 6 are substantially equal to each other.

In Step S414, if the comparator 16 determines that the voltage Vp is not less than the voltage Vn, the first selection circuit 321 outputs the second reference voltage V2 to the second capacitor C2pb of the second set of capacitors of the first capacitor array 341, and the second selection circuit 322 outputs the first reference voltage V1 to the first capacitor C2na of the second set of capacitors of the second capacitor array 342, as indicated in Table 8 (Step S418).

TABLE 8

| Capacitor | C1pa1 | C1pa2 | C1pb1 | C1pb2 | C2pa | C2pb | C3pa | C3pb |
|---|---|---|---|---|---|---|---|---|
| Lower plate voltage | V2 | V2 | V2 | V2 | V2 | "V2" | V2 | V1 |

| Capacitor | C1na1 | C1na2 | C1nb1 | C1nb2 | C2na | C2nb | C3na | C3nb |
|---|---|---|---|---|---|---|---|---|
| Lower plate voltage | V1 | V1 | V1 | V1 | "V1" | V1 | V2 | V1 |

In Step S402, if the voltage Vp is not higher than the voltage Vn, the first selection circuit 321 outputs the first reference voltage V1 to the first capacitor portion C1pa1 and the second capacitor portion C1pa2 of the first capacitor C1pa of the first set of capacitors of the first capacitor array 341, and the second selection circuit 322 outputs the second reference voltage V2 to the first capacitor portion C1nb1 and the second capacitor portion C1nb2 of the second capacitor C1nb of the first set of capacitors of the second capacitor array 342, as indicated in Table 9 (Step S422):

TABLE 9

| Capacitor | C1pa1 | C1pa2 | C1pb1 | C1pb2 | C2pa | C2pb | C3pa | C3pb |
|---|---|---|---|---|---|---|---|---|
| Lower plate voltage | "V1" | "V1" | V1 | V1 | V2 | V1 | V2 | V1 |

| Capacitor | C1na1 | C1na2 | C1nb1 | C1nb2 | C2na | C2nb | C3na | C3nb |
|---|---|---|---|---|---|---|---|---|
| Lower plate voltage | V2 | V2 | "V2" | "V2" | V2 | V1 | V2 | V1 |

During the second conversion period, the comparator 16 determines whether the voltage Vp is higher than the voltage Vn (Step S424). If the voltage Vp is higher than the voltage Vn, the first selection circuit 321 outputs the second reference voltage V2 to the first capacitor portion C1pa1 of the first capacitor C1pa of the first set of capacitors in the capacitor array 341 or the first capacitor portion C1pb1 of the second capacitor C1pb of the first set of capacitors of the first capacitor array 341, the second selection circuit 322 outputs the first reference voltage V1 to the first capacitor portion C1na1 of the first capacitor C1na of the first set of capacitors of the second capacitor array 342 or the first capacitor portion C1nb1 of the second capacitor C1nb of the first set of capacitors of the second capacitor array 342 (Step S426). In some embodiments, the first selection circuit 321 may output the second reference voltage V2 to the first capacitor portion C1pa1 and the second capacitor portion V1 of the first capacitor C1pa of the first set of capacitors of the first capacitor array 341, so as to switch the first capacitor portion C1pa1 back to the reset value thereof (V1), and the second selection circuit 322 may output the first reference voltage V1 to the first capacitor portion C1nb1 and the second capacitor portion C1nb1 of the second capacitor C1nb of the first set of capacitors of the second capacitor array 342, so as to switch the second capacitor portion C1na1 back to the reset value thereof (V2), as indicated in Table 10:

TABLE 10

| Capacitor | C1pa1 | C1pa2 | C1pb1 | C1pb2 | C2pa | C2pb | C3pa | C3pb |
|---|---|---|---|---|---|---|---|---|
| Lower plate voltage | "V2" | V1 | V1 | V1 | V2 | V1 | V2 | V1 |

| Capacitor | C1na1 | C1na2 | C1nb1 | C1nb2 | C2na | C2nb | C3na | C3nb |
|---|---|---|---|---|---|---|---|---|
| Lower plate voltage | V2 | V2 | "V1" | V2 | V2 | V1 | V2 | V1 |

In other embodiments, the first selection circuit 321 outputs the second reference voltage V2 to the first capacitor portion C1pb 1 of the second capacitor C1pb of the first set of capacitors of the first capacitor array 341, and the second selection circuit 322 outputs the first reference voltage V1 to the first capacitor portion C1na1 of the first capacitor C1na of the first set of capacitors of the second capacitor array 342, as indicated in Table 11:

TABLE 11

| Capacitor | C1pa1 | C1pa2 | C1pb1 | C1pb2 | C2pa | C2pb | C3pa | C3pb |
|---|---|---|---|---|---|---|---|---|
| Lower plate voltage | V1 | V1 | "V2" | V1 | V2 | V1 | V2 | V1 |

| Capacitor | C1na1 | C1na2 | C1nb1 | C1nb2 | C2na | C2nb | C3na | C3nb |
|---|---|---|---|---|---|---|---|---|
| Lower plate voltage | "V1" | V2 | V2 | V2 | V2 | V1 | V2 | V1 |

In other embodiments, the first selection circuit 321 and the second selection circuit 322 may respectively output the voltages of the voltage settings as indicated in Table 10 and Table 11 to the first capacitor array 341 and the second capacitor array 342 according to a uniform sequence. The uniform order may be an alternating order or a random order. When the uniform sequence is an alternating sequence, the first selection circuit 321 and the second selection circuit 322 may respectively output the voltage settings in Table 10 and Table 11 to the first capacitor array 341 and the second capacitor array 342 during a plurality of conversion periods. When the uniform sequence is a random sequence, the first selection circuit 321 and the second selection circuit 322 may randomly output the voltage settings in Table 10 and Table 11 to the first capacitor array 341 and the second capacitor array 342 during a plurality of conversion periods, respectively. The probabilities of employing the voltage settings in Table 10 and Table 11 are substantially equal to each other.

In Step S424, if the comparator 16 determines that the voltage Vp is no higher than the voltage Vn, the first selection circuit 321 outputs the first reference voltage V1 to the first capacitor C2pa of the second set of capacitors of the first capacitor array 341, and the second selection circuit 322 outputs the second reference voltage V2 to the second capacitor C2nb of the second set of capacitors of the second capacitor array 342, as indicated in Table 12 (Step S418).

TABLE 12

| Capacitor | C1pa1 | C1pa2 | C1pb1 | C1pb2 | C2pa | C2pb | C3pa | C3pb |
|---|---|---|---|---|---|---|---|---|
| Lower plate voltage | V1 | V1 | V1 | V1 | "V1" | V1 | V2 | V1 |

| Capacitor | C1na1 | C1na2 | C1nb1 | C1nb2 | C2na | C2nb | C3na | C3nb |
|---|---|---|---|---|---|---|---|---|
| Lower plate voltage | V2 | V2 | V2 | V2 | V2 | "V2" | V2 | V1 |

In other embodiments, the first selection circuit 321 and the second selection circuit 322 use a second voltage setting during the sampling stage to reset the capacitors C1pa1, C1pa2, C1pb1, C1pb2, C2pa, C2pb, C3pa, C3pb and capacitors C1na1, C1na2, C1nb1, C1nb2, C2na, C2nb, C3na, C3nb, as indicated in Table 3. The first reference voltage V1 may be the supply voltage and the second reference voltage V2 may be the ground voltage. After the quantization stage starts, during the first conversion period, the comparator 16 determines whether the voltage Vp is higher than the voltage Vn (Step S402).

In the embodiment of the method 400, the second conversion period is not limited to be immediately after or immediately subsequent to the first conversion period. In some embodiments, the second conversion period may be immediately subsequent to the first conversion period. In other embodiments, the second conversion period and the first conversion period may be separated by a time interval. In some embodiments, if the capacitor arrays are configured into a larger number of bits (e.g., 10-bits), the first capacitor and the second capacitor of a larger set of capacitors may be split into a plurality of capacitor portions, respectively. The respective capacitances are substantially equal to the capacitances of one or more of smaller capacitors, and the method 400 may be used to perform an analog-to-digital conversion.

The method 400 may be used with the method 200 or the sampling method in the related art. When the method 400 is used in conjunction with the sampling method in the related art, the method 400 may reduce the differential nonlinearity error and integral non-linearity error of the first capacitor array 341 and the second capacitor array 342 owing to the capacitor mismatch between different sets of capacitors.

When the method 400 is used in conjunction with the method 200, the method 200 serves to reduce the nonlinearity error owing to the capacitance mismatch in the same set of capacitors, and the method 400 serves to reduce the nonlinearity error owing to the capacitance mismatch between different sets of capacitors. Therefore, the overall differential nonlinearity error and integral nonlinearity error are reduced. In one example, the first capacitor array 341 and the second capacitor array 342 both include 10-bit capacitors, each set of capacitors has a capacitance with a standard deviation of 2% tolerance, the first capacitor and the second capacitor of each set of capacitors are operated in a uniform sequence in several sampling stages by the method 200 and the method 400, and a capacitor portion of a set of larger capacitors is switched back to the reset value in a non-MSB conversion upon satisfying the condition set in the method 400. In such a case, the maximum differential nonlinearity error will be reduced from 0.37LSB to 0.22LSB, and the maximum integral nonlinearity error will be reduced from 0.8LSB to 0.48LSB.

The present invention is not limited to the 3-bit SAR ADC, and those skilled in the art may also apply the methods 200, 400 to other sizes of SAR ADCs according to the principle of the present invention. The analog-to-digital converters 1, 3 and the operation method 200 reset the first capacitor arrays 141, 341 and the second capacitor arrays 142, 342 in a uniformly manner during a plurality of sampling stages using the first voltage setting and the second voltage setting. The converter 3 and the operation method 400 employ the switch-back technique to switch the first capacitor array 341 and the second capacitor array 342, so as to reduce the differential non-linearity error and integral non-linearity owing to the capacitance mismatch between the same set of capacitors or different sets of capacitors, significantly enhancing the linearity of the SAR ADC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of operating an analog-to-digital converter, the analog-to-digital converter comprising a first capacitor array, a first selection circuit, a second capacitor array, a second selection circuit and a control logic circuit, the first capacitor array comprising a plurality of sets of capacitors, each set of capacitors of the first capacitor array comprising a first capacitor and a second capacitor, the second capacitor array comprising a plurality of sets of capacitors, and each set of capacitors of the second capacitor array comprising a first capacitor and a second capacitor, the first selection circuit being coupled to the first capacitor array, the second selection circuit being coupled to the second capacitor array, the control logic circuit being coupled to the first selection circuit and the second selection circuit, the method comprising:

in a first sampling stage, switching a switching signal to a first level for the first selection circuit to output a first reference voltage to the first capacitor in each set of capacitors of the first capacitor array and output a second reference voltage to the second capacitor in each set of capacitors of the first capacitor array, and for the second selection circuit to output the first reference voltage to the first capacitor in each set of capacitors of the second capacitor array and output the second reference voltage to the second capacitor in each set of capacitors of the second capacitor array; and in a second sampling stage, switching a switching signal to a second level for the first selection circuit to output the second reference voltage to the first capacitor in each set of capacitors of the first capacitor array and output the first reference voltage to the second capacitor in each set of capacitors of the first capacitor array, and for the second selection circuit to output the second reference voltage to the first capacitor in each set of capacitors of the second capacitor array and output the first reference voltage to the second capacitor in each set of capacitors of the second capacitor array;

wherein the control logic circuit switches the switching signal between the first level and the second level according to a uniform sequence during a plurality of sampling stages, and the first level and the second level are different from each other.

2. The method of claim 1, wherein the uniform sequence is an alternating sequence.

3. The method of claim 1, wherein the uniform sequence is a random sequence.

4. The method of claim 1, wherein the uniform sequence is a predetermined sequence.

5. The method of claim 1, wherein:
the first capacitor and the second capacitor of each set of capacitors of the first capacitor array are substantially equal in capacitance; and
the first capacitor and the second capacitor of each set of capacitors of the second capacitor array are substantially equal in capacitance.

6. The method of claim 1, wherein:
the analog-to-digital converter further comprises a comparator comprising a first input terminal coupled to the first capacitor array, and a second input terminal coupled to the second capacitor array;
a capacitance of a first capacitor portion of a first capacitor of a set of larger capacitors of the first capacitor array is substantially equal to a capacitance of a first capacitor of a set of smaller capacitors of the first capacitor array; and a capacitance of a first capacitor portion of a second capacitor of the set of larger capacitors of the first capacitor array is substantially equal to the capacitance of the first capacitor of the set of smaller capacitors of the first capacitor array;
a capacitance of a first capacitor portion of a first capacitor of a set of larger capacitors of the second capacitor array is substantially equal to a capacitance of a first capacitor of a set of smaller capacitors of the second capacitor array; and a capacitance of a first capacitor portion of a second capacitor of the set of larger capacitors of the second capacitor array is substantially equal to the capacitance of the first capacitor of the set of smaller capacitors of the second capacitor array; and
the method further comprises:
in a first conversion period, if a voltage at the first input terminal of the comparator is higher than a voltage at the second input terminal, the first selection circuit outputting the second reference voltage to the second capacitor of the set of larger capacitor of the first capacitor array, the second selection circuit outputting the first reference voltage to the first capacitor of the set of larger capacitors of the second capacitor array; and
in a second conversion period subsequent to the first conversion period, if the voltage at the first input terminal of the comparator is less than the voltage at the second input terminal of the comparator, the first selection circuit outputting the first reference voltage to the first capacitor portion of the first capacitor of the set of larger capacitors in the capacitor array or the first capacitor portion of the second capacitor of the set of larger capacitors of the first capacitor array, and the second selection circuit outputting the second reference voltage to the first capacitor portion of the first capacitor of the set of larger capacitors of the second capacitor array or the first capacitor portion of the second capacitor of the set of larger capacitors of the second capacitor array.

7. The method of claim 1, wherein:
the analog-to-digital converter further comprises a comparator comprising a first input terminal coupled to the first capacitor array, and a second input terminal coupled to the second capacitor array;
a capacitance of a first capacitor portion of a first capacitor of a larger capacitor of the first capacitor array is substantially equal to a capacitance of a first capacitor of a smaller capacitors of the first capacitor array; and a capacitance of a first capacitor portion of a second capacitor of the larger capacitors of the first capacitor array is substantially equal to the capacitance of the first capacitor of the smaller capacitors of the first capacitor array;
a capacitance of a first capacitor portion of a first capacitor of a larger capacitors of the second capacitor array is substantially equal to a capacitance of a first capacitor of a smaller capacitors of the second capacitor array; and a capacitance of a first capacitor portion of a second capacitor of the larger capacitors of the second capacitor array is substantially equal to the capacitance of the first capacitor of the smaller capacitors of the second capacitor array; and
the method further comprises:
in a first conversion period, if a voltage at the first input terminal of the comparator is less than a voltage at the second input terminal, the first selection circuit outputting the first reference voltage to the first capacitor of the larger capacitor of the first capacitor array, the second selection circuit outputting the second reference voltage to the second capacitor of the larger capacitors of the second capacitor array; and
in a second conversion period subsequent to the first conversion period, if the voltage at the first input terminal of the comparator is higher than the voltage at the second input terminal of the comparator, the first selection circuit outputting the second reference voltage to the first capacitor portion of the first capacitor of the larger capacitors in the capacitor array or the first capacitor portion of the second capacitor of the larger capacitors of the first capacitor array, the second selection circuit outputting the first reference voltage to the first capacitor portion of the first capacitor of the larger capacitors of the second capacitor array or the first capacitor portion of the second capacitor of the larger capacitors of the second capacitor array.

8. An analog-to-digital converter comprising:
a first selection circuit;
a second selection circuit;
a first capacitor array coupled to the first selection circuit, and comprising a plurality of capacitors, each capacitor of the first capacitor array comprising a first capacitor and a second capacitor;

a second capacitor array coupled to the second selection circuit, and comprising a plurality of capacitors, each capacitor of the second capacitor array comprising a first capacitor and a second capacitor;

a comparator comprising a first input terminal coupled to the first capacitor array, a second input terminal coupled to the second capacitor array, and an output terminal; and a control logic circuit coupled to the output terminal of the comparator, the first selection circuit and the second selection circuit;

wherein in a first sampling stage, the control logic circuit is configured to switch a switching signal to a first level for the first selection circuit to output a first reference voltage to the first capacitor in each set of capacitors of the first capacitor array and output a second reference voltage to the second capacitor in each set of capacitors of the first capacitor array, and for the second selection circuit to output the first reference voltage to the first capacitor in each set of capacitors of the second capacitor array and output the second reference voltage to the second capacitor in each set of capacitors of the second capacitor array;

in a second sampling stage, the control logic circuit is configured to switch a switching signal to a second level for the first selection circuit to output the second reference voltage to the first capacitor in each set of capacitors of the first capacitor array and output the first reference voltage to the second capacitor in each set of capacitors of the first capacitor array, and for the second selection circuit to output the second reference voltage to the first capacitor in each set of capacitors of the second capacitor array and output the first reference voltage to the second capacitor in each set of capacitors of the second capacitor array; and the control logic circuit is configured to switch the switching signal between the first level and the second level according to a uniform sequence during a plurality of sampling stages, and the first level and the second level are different from each other.

9. The analog-to-digital converter of claim 8, wherein:

the first selection circuit comprises a plurality of multiplexers, each multiplexer of the first selection circuit comprising a first input terminal, a second input terminal, and a selection terminal coupled to the control logic circuit and configured to receive the switching signal, and an output terminal configured to output a voltage at the first input terminal or a voltage at the second input terminal according to the switching signal; and the second selection circuit comprises a plurality of multiplexers, each multiplexer of the second selection circuit comprising a first input terminal, a second input terminal, and a selection terminal coupled to the control logic circuit and configured to receive the switching signal, and an output terminal configured to output a voltage at the first input terminal or a voltage at the second input terminal according to the switching signal.

10. The analog-to-digital converter of claim 8, wherein:

the first capacitor and the second capacitor of each set of capacitors of the first capacitor array are substantially equal in capacitance; and the first capacitor and the second capacitor of each set of capacitors of the second capacitor array are substantially equal in capacitance.

11. The analog-to-digital converter of claim 8, wherein the uniform sequence is an alternating sequence.

12. The analog-to-digital converter of claim 8, wherein the uniform sequence is a random sequence.

13. The analog-to-digital converter of claim 8, wherein the uniform sequence is a predetermined sequence.

14. The analog-to-digital converter of claim 8, wherein:

a capacitance of a first capacitor portion of a first capacitor of a set of larger capacitors of the first capacitor array is substantially equal to a capacitance of a first capacitor of a set of smaller capacitors of the first capacitor array; and a capacitance of a first capacitor portion of a second capacitor of the set of larger capacitors of the first capacitor array is substantially equal to the capacitance of the first capacitor of the set of smaller capacitors of the first capacitor array;

a capacitance of a first capacitor portion of a first capacitor of a set of larger capacitors of the second capacitor array is substantially equal to a capacitance of a first capacitor of a set of smaller capacitors of the second capacitor array; and a capacitance of a first capacitor portion of a second capacitor of the set of larger capacitors of the second capacitor array is substantially equal to the capacitance of the first capacitor of the set of smaller capacitors of the second capacitor array;

in a first conversion period, if a voltage at the first input terminal of the comparator is higher than a voltage at the second input terminal, the first selection circuit is configured to output the second reference voltage to the second capacitor of the set of larger capacitor of the first capacitor array, the second selection circuit is configured to output the first reference voltage to the first capacitor of the set of larger capacitors of the second capacitor array; and in a second conversion period subsequent to the first conversion period, if the voltage at the first input terminal of the comparator is less than the voltage at the second input terminal of the comparator, the first selection circuit is configured to output the first reference voltage to the first capacitor portion of the first capacitor of the set of larger capacitors in the capacitor array or the first capacitor portion of the second capacitor of the set of larger capacitors of the first capacitor array, and the second selection circuit is configured to output the second reference voltage to the first capacitor portion of the first capacitor of the set of larger capacitors of the second capacitor array or the first capacitor portion of the second capacitor of the set of larger capacitors of the second capacitor array.

15. The analog-to-digital converter of claim 8, wherein:

a capacitance of a first capacitor portion of a first capacitor of a larger capacitor of the first capacitor array is substantially equal to a capacitance of a first capacitor of a smaller capacitors of the first capacitor array; and a capacitance of a first capacitor portion of a second capacitor of the larger capacitors of the first capacitor array is substantially equal to the capacitance of the first capacitor of the smaller capacitors of the first capacitor array;

a capacitance of a first capacitor portion of a first capacitor of a larger capacitors of the second capacitor array is substantially equal to a capacitance of a first capacitor of a smaller capacitors of the second capacitor array; and a capacitance of a first capacitor portion of a second capacitor of the larger capacitors of the second capacitor array is substantially equal to the capacitance of the first capacitor of the smaller capacitors of the second capacitor array; and in a first conversion period, if a voltage at the first input terminal of the comparator is less than a voltage at the second input terminal, the first selection circuit is configured to output the first reference voltage to the first capacitor of the larger capacitor of the first capacitor array, the second selection circuit is configured to output the second reference voltage to the second capacitor of the larger capacitors of the second capacitor array; and in a second conversion period subsequent to the first conversion period, if the voltage at the first input terminal of the comparator is higher than the voltage at the second input terminal of the comparator, the first selection circuit is configured to output the second reference voltage to the first capacitor portion of the first capacitor of the larger capacitors in the capacitor array or the first capacitor portion of the second capacitor of the larger capacitors of the first capacitor array, the second selection circuit is configured to output the first reference voltage to the first capacitor portion of the first capacitor of the larger capacitors of the second capacitor array or the first capacitor portion of the second capacitor of the larger capacitors of the second capacitor array.

* * * * *